(12) United States Patent
Kumagai et al.

(10) Patent No.: US 7,771,835 B2
(45) Date of Patent: *Aug. 10, 2010

(54) COPPER ELECTROLYTIC SOLUTION CONTAINING QUATERNARY AMINE COMPOUND WITH SPECIFIC SKELETON AND ORAGNO-SULFUR COMPOUND AS ADDITIVES, AND ELECTROLYTIC COPPER FOIL MANUFACTURED USING THE SAME

(75) Inventors: Masashi Kumagai, Hitachi (JP); Mikio Hanafusa, Hitachi (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 933 days.

This patent is subject to a terminal disclaimer.

(21) Appl. No.: 11/586,906

(22) Filed: Oct. 26, 2006

(65) Prior Publication Data

US 2007/0042201 A1 Feb. 22, 2007

Related U.S. Application Data

(63) Continuation-in-part of application No. 10/480,710, filed as application No. PCT/JP03/10552 on Aug. 20, 2003, now Pat. No. 7,144,491.

(30) Foreign Application Priority Data

Oct. 21, 2002 (JP) ............................ 2002-305650

(51) Int. Cl.
*B32B 15/04* (2006.01)
*B32B 15/08* (2006.01)
*C22C 9/00* (2006.01)

(52) U.S. Cl. .................. 428/458; 428/457; 420/469

(58) Field of Classification Search .................. None
See application file for complete search history.

(56) References Cited

U.S. PATENT DOCUMENTS

| | | | |
|---|---|---|---|
| 3,636,114 A | 1/1972 | Tobler et al. | |
| 4,036,711 A | 7/1977 | Kardos et al. | |
| 4,110,176 A | 8/1978 | Creutz et al. | |
| 4,336,114 A | 6/1982 | Mayer et al. | |
| 4,384,930 A | 5/1983 | Eckles | |
| 4,490,220 A | 12/1984 | Houman | |
| 4,555,315 A | 11/1985 | Barbieri et al. | |
| 6,800,188 B2 | 10/2004 | Hagiwara et al. | |
| 7,115,681 B2 * | 10/2006 | Shimo-Ohsako et al. | 524/538 |
| 7,144,491 B2 * | 12/2006 | Kumagai et al. | 205/296 |
| 2001/0055691 A1 * | 12/2001 | Yamamoto et al. | 428/473.5 |

FOREIGN PATENT DOCUMENTS

| | | |
|---|---|---|
| EP | 0 107 109 A2 | 5/1984 |
| EP | 1 069 211 | 1/2001 |
| EP | 1 219 729 | 7/2002 |
| EP | 1 264 918 | 12/2002 |
| JP | 08-053789 | 2/1996 |
| JP | 2002-508452 | 3/2002 |
| WO | WO 99/31300 | 6/1999 |

OTHER PUBLICATIONS

Korean Offiice Action dated Oct. 7, 2005 (2 pages).

* cited by examiner

*Primary Examiner*—Monique R Jackson
(74) *Attorney, Agent, or Firm*—Flynn, Thiel, Boutell & Tanis, P.C.

(57) ABSTRACT

It is an object of the present invention to obtain a low-profile electrolytic copper foil with a small surface roughness on the side of the rough surface (the opposite side from the lustrous surface) in the manufacture of an electrolytic copper foil using a cathode drum, and more particularly to obtain an electrolytic copper foil which allows fine patterning, and which is superior in terms of elongation and tensile strength at ordinary temperatures and high temperatures. Furthermore, it is an object of the present invention to obtain a copper electrolytic solution for this purpose. This copper electrolytic solution contains as additives an organo-sulfur compound and a quaternary amine compound with a specific skeleton.

8 Claims, 4 Drawing Sheets

COPPER ELECTROLYTIC SOLUTION CONTAINING QUATERNARY AMINE COMPOUND WITH SPECIFIC SKELETON AND ORAGNO-SULFUR COMPOUND AS ADDITIVES, AND ELECTROLYTIC COPPER FOIL MANUFACTURED USING THE SAME

This is a continuation-in-part of Ser. No. 10/480,710, filed Dec. 11, 2003, now U.S. Pat. No. 7,144,491 which was the national stage of International Application No. PCT/JP03/10552, filed Aug. 20, 2003, which International Application was not published in English.

TECHNICAL FIELD

The present invention relates to a copper electrolytic solution used in the manufacture of an electrolytic copper foil, and more particularly to a copper electrolytic solution which is used in the manufacture of an electrolytic copper foil that allows fine patterning and that is superior in terms of elongation and tensile strength at ordinary temperatures and high temperatures.

BACKGROUND ART

Generally, a rotating metal cathode drum with a polished surface, and an insoluble metal anode which is disposed on more or less the lower half of this cathode drum and surrounds the circumference of the cathode drum, are used to manufacture electrolytic copper foils. A copper electrolytic solution is caused to flow between the above-mentioned drum and anode, and an electrical potential is applied across these parts, so that copper is electrodeposited on the cathode drum. Then, when the electrodeposited copper has reached a specified thickness, this deposited copper is peeled from the cathode drum, so that a copper foil is continuously manufactured.

The copper foil thus obtained is generally referred to as a raw foil; this foil is subsequently subject to several surface treatments, and is used in printed wiring boards or the like.

An outline of a conventional copper foil manufacturing apparatus is shown in FIG. 4. In this electrolytic copper foil manufacturing apparatus, a cathode drum 1 is disposed in an electrolytic bath at which accommodates an electrolytic solution. This cathode drum 1 rotates in a state in which the drum is partially immersed (i.e., more or less the lower half of the drum is immersed) in the electrolytic solution.

An insoluble anode 2 is disposed so that this anode surrounds the lower half of the circumference of the cathode drum 1. There is a fixed gap 3 between this cathode drum 1 and anode 2, and an electrolytic solution flows through this gap. Two anode plates are disposed in the apparatus shown in FIG. 4.

In this apparatus shown in FIG. 4, the electrolytic solution is supplied from below; the apparatus is constructed so that this electrolytic solution passes through the gap 3 between the cathode drum 1 and anode 2 and overflows from the upper rim of the anode 2, and so that this electrolytic solution is recirculated. A specified voltage can be maintained between the cathode drum 1 and anode 2 by interposing a rectifier between these members.

As the cathode drum 1 rotates, the thickness of the copper electrodeposited from the electrolytic solution increases, and when this thickness exceeds a certain thickness, the raw foil 4 is peeled away and continuously taken up. The thickness of the raw foil that is thus manufactured can be adjusted by adjusting the distance between the cathode drum 1 and the anode 2, the flow velocity of the electrolytic solution that is supplied, or the amount of electricity that is supplied.

In the copper foil that is manufactured by such an electrolytic copper foil manufacturing apparatus, the surface that contacts the cathode drum is a mirror surface; however, the surface on the opposite side is a rough surface with projections and indentations. In the case of ordinary electrolysis, the projections and indentations of this rough surface are severe, so that undercutting tends to occur during etching, and the achievement of a fine pattern is difficult.

Recently, meanwhile, as the density of printed wiring boards has increased, the narrowing of circuit width and the development of multi-layer circuits have led to a demand for copper foils that allow fine patterning. In order to achieve such fine patterning, a copper foil that is superior in terms of etching characteristics is required.

Furthermore, in regard to the performance values required in copper foils used in printed wiring boards, not only elongation at ordinary temperatures, but also high-temperature elongation characteristics for the purpose of preventing cracking caused by thermal stress, and a high tensile strength for dimensional stability of the printed wiring board, are required. However, copper foils of the above-mentioned type in which the projections and indentations of the rough surface are severe are completely unsuitable for fine patterning, as was described above. For such reasons, smoothing of the rough surface to a low profile has been investigated.

It is generally known that such a low profile can be achieved by adding large amounts of glue or thiourea to the electrolytic solution.

However, such additives lead to the problem of an abrupt drop in the elongation at ordinary temperatures and high temperatures, thus causing a great drop in the performance as a copper foil for use in printed wiring boards.

DISCLOSURE OF THE INVENTION

It is an object of the present invention to obtain a low-profile electrolytic copper foil with a small surface roughness on the side of the rough surface (the opposite side from the lustrous surface) in the manufacture of an electrolytic copper foil using a cathode drum, and more particularly to obtain an electrolytic copper foil which allows fine patterning, and which is superior in terms of elongation and tensile strength at ordinary temperatures and high temperatures.

The present inventors discovered that an electrolytic copper foil which allows fine patterning, and which is superior in terms of elongation and tensile strength at ordinary temperatures and high temperatures, can be obtained by adding an optimal amount of an additive, which makes it possible to achieve a low profile to the electrolytic solution.

On the basis of this finding, the present inventors discovered that an electrolytic copper foil which allows fine patterning and which is superior in terms of elongation and tensile strength at ordinary temperatures and high temperatures can be obtained by performing electrolysis using a copper electrolytic solution containing a quaternary amine compound with a specific skeleton and an organo-sulfur compound in an electrolytic copper foil manufacturing method in which a copper foil is continuously manufactured by causing a copper electrolytic solution to flow between a cathode drum and an anode so that copper is electrodeposited on the cathode drum, and peeling the electrodeposited copper foil from the cathode drum. This discovery led to the present invention.

Specifically, the present invention comprises the following constructions:

[1] A copper electrolytic solution which contains as additives an organo-sulfur compound and a quaternary amine compound with a specific skeleton expressed by the following general formula (1) which is obtained by an addition reaction between a compound which has one or more epoxy groups per molecule and an amine compound, followed by a quaternization of the nitrogen.

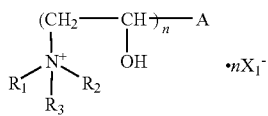

(1)

(In general formula (1), $R_1$ and $R_2$ each separately is a group selected from the group consisting of a hydroxyalkyl group, an ether group, an aromatic group, an aromatic-substituted alkyl group, an unsaturated hydrocarbon group and an alkyl group, $R_3$ is a benzyl group, an allyl group or an alkyl group, A is an epoxy compound residue, $X_1^-$ indicates $Cl^-$, $Br^-$ or $CH_3SO_4^-$, and n is an integer of 1 or greater.)

[2] The copper electrolytic solution according to the above [1], in which the epoxy compound residue A of the quaternary amine compound with a specific skeleton has a linear ether linkage.

[3] The copper electrolytic solution according to the above [1] or [2], in which the quaternary amine compound with a specific skeleton is one of the compounds expressed by the following general formulae (2) through (9).

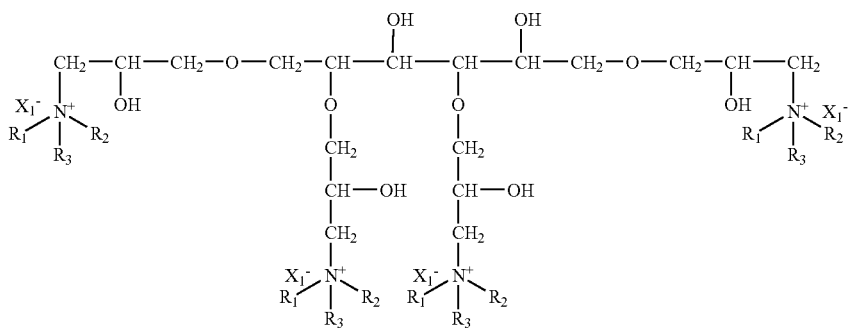

(2)

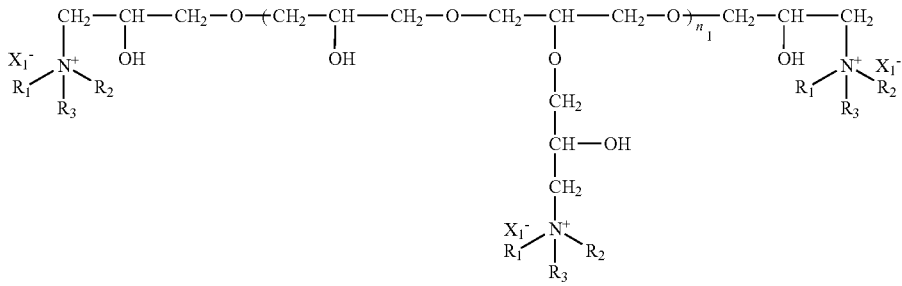

(3)

($n_1$: an integer of 1 to 5)

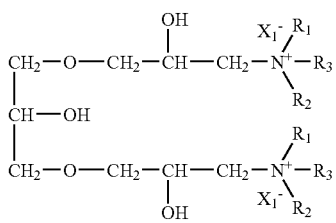

(4)

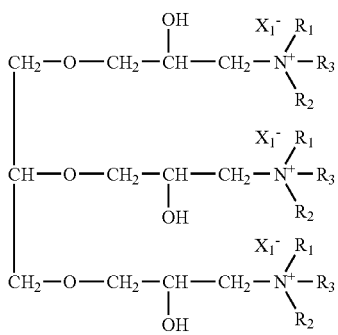

(5)

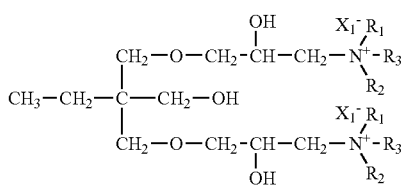

(6)

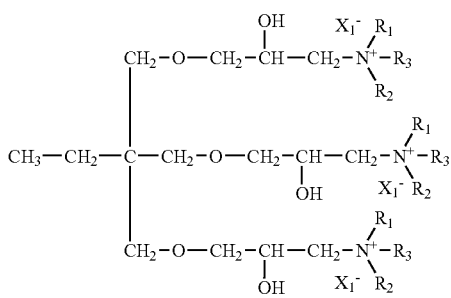

(7)

-continued

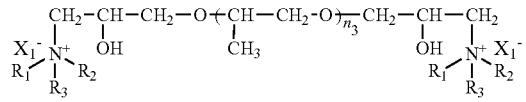

(8)

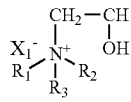 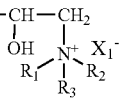

($n_2$: an integer of 1 to 22)

(9)

($n_3$: an integer of 1 to 3)

(In general formulae (2) through (9), $R_1$ and $R_2$ each indicate a group selected from the group consisting of a hydroxyalkyl group, an ether group, an aromatic group, an aromatic-substituted alkyl group, an unsaturated hydrocarbon group and an alkyl group, $R_3$ indicates a benzyl group, an allyl group or an alkyl group with 1 to 5 carbon atoms, and $X_1^-$ indicates $Cl^-$, $Br^-$ or $CH_3SO_4^-$.)

[4] The copper electrolytic solution according to the above 1, in which the organo-sulfur compound is a compound expressed by general formula (10) or (11).

$$X—R^1—(S)_{n4}—R^2—Y \quad (10)$$

$$R^4—S—R^3—SO_3Z \quad (11)$$

(In general formulae (10) and (11), $R^1$, $R^2$ and $R^3$ each indicate an alkylene group with 1 to 8 carbon atoms, $R^4$ indicates a group selected from the group consisting of hydrogen,

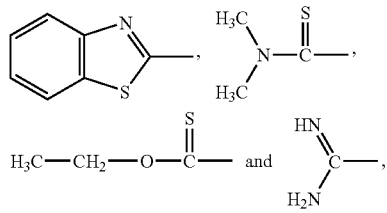

X indicates a group selected from the group consisting of a sulfonic acid group, a phosphonic acid group, and a sulfonic acid- or phosphonic acid-alkali metal salt group or ammonium salt group, Y indicates a group selected from the group consisting of a sulfonic acid group, a phosphonic acid group, and a sulfonic acid- or phosphonic acid-sodium or potassium salt group, Z indicates hydrogen, sodium or potassium, and $n_4$ is 2 or 3.)

[5] An electrolytic copper foil which is manufactured using the copper electrolytic solution according to any of the above [1] through [4].

[6] A copper-clad laminated board which is formed using the electrolytic copper foil according to the above [5].

In the present invention, it is important that the electrolytic solution contain an organo-sulfur compound and a quaternary amine compound with a specific skeleton expressed by the above-defined general formula (1) which is obtained by an addition reaction between a compound that has one or more epoxy groups per molecule and an amine compound, followed by a quaternization of the nitrogen. If only one of these compounds is added, the object of the present invention cannot be achieved.

The quaternary amine compound (1) with a specific skeleton is obtained by synthesizing an amine compound with this specific skeleton by an addition reaction expressed by the reaction formula shown below, followed by a quaternization of the nitrogen. Specifically, this compound can be manufactured by synthesizing an amine compound with a specific skeleton by mixing a compound that has one or more epoxy groups per molecule and an amine compound and reacting these compounds for approximately 30 minutes to 6 hours at 50 to 150° C., and then quaternizing the nitrogen by adding a quaternizing agent and performing a reaction for approximately 30 minutes to 6 hours at 50 to 150° C.

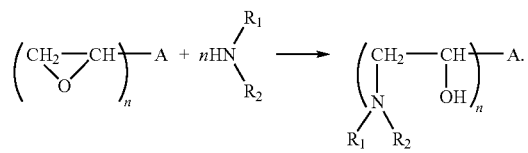

(In the above formula, $R_1$ and $R_2$ each separately is a group selected from the group consisting of a hydroxyalkyl group, an ether group, an aromatic group, an aromatic-substituted alkyl group, an unsaturated hydrocarbon group and an alkyl group, A is an epoxy compound residue, and n is an integer of 1 or greater.)

Concrete examples of $R_1$ and $R_2$ in the structure of the amine compound with a specific skeleton include hydroxyethyl group, hydroxyisopropyl group (both hydroxyalkyl groups), 2-ethoxyethyl group, 2-propoxyethyl group (both ether groups), phenyl group, naphthyl group (both aromatic groups), tolyl group, xylyl group, cumenyl group, 1-phenylethyl group (all aromatic-substituted alkyl groups), allyl group, 1-propenyl group, isopropenyl group, 1-butenyl group, 2-butenyl group, 2-methylallyl group (all unsaturated hydrocarbon groups), methyl group, ethyl group, propyl group, butyl group, pentyl group, hexyl group, heptyl group and octyl group (all alkyl groups). From the standpoint of water solubility, substituent groups with an excessively large number of carbon atoms are undesirable; it is desirable that the number of carbon atoms per substituent group be 8 or less.

Examples of quaternizing agents that can be used to quaternize the nitrogen include alkyl halides, benzyl chloride, dimethylsulfuric acid, allyl bromide and the like. $R_3$ and $X_1^-$ in general formula (1) are determined by this quaternizing agent.

Alkyl groups with 1 to 8 carbon atoms are desirable as the alkyl group in $R_3$. Alkyl groups with 1 to 5 carbon atoms are even more desirable.

Compounds which have a linear ether linkage in the epoxy compound residue A are desirable as the above-mentioned quaternary amine compound with a specific skeleton; compounds expressed by the following general formulae (2) through (9) are desirable as the above-mentioned quaternary amine compound in which the epoxy compound residue A has a linear ether linkage. These compounds can be obtained by using polyglycidyl ethers of polyhydric alcohols, for example, sorbitol polyglycidyl ethers, polyglycerol polyglycidyl ethers, glycerol polyglycidyl ethers, trimethylolpropane polyglycidyl ethers, ethylene glycol diglycidyl ethers, polyethylene glycol diglycidyl ethers, propylene glycol diglycidyl ethers, polypropylene glycol diglycidyl ethers or the like as raw-material compounds which have one or more epoxy groups per molecule. Furthermore, compounds expressed by the following general formulae (2) through (9) need not be used singly, but may also be used "as is" in mixtures in cases where the manufactured product is obtained as a mixture, as indicated for example by the compounds expressed by the general formulae (6) and (7). The epoxy compound residues A in general formulae (2) through (9) are as shown below.

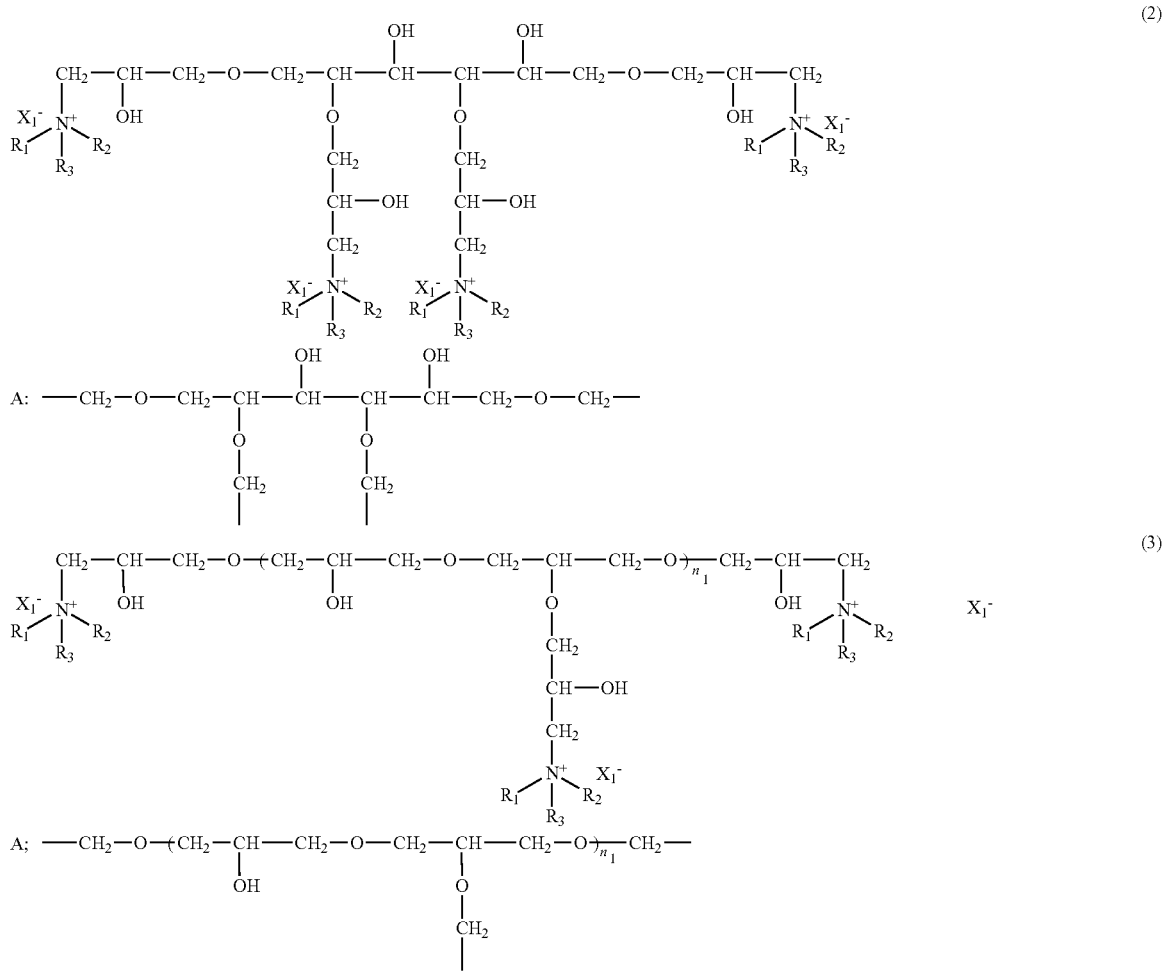

($n_1$: an integer of 1 to 5)

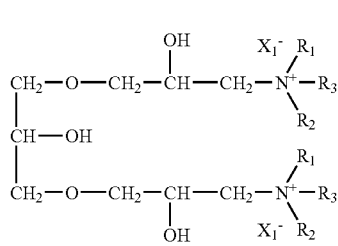

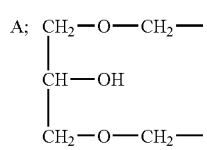

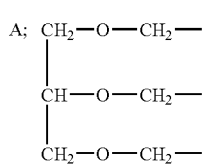

(6)
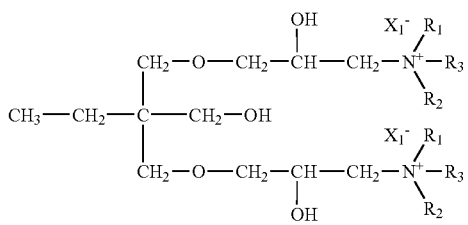

A; 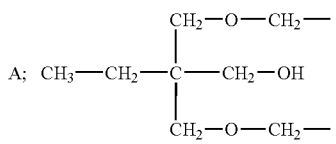

(7)
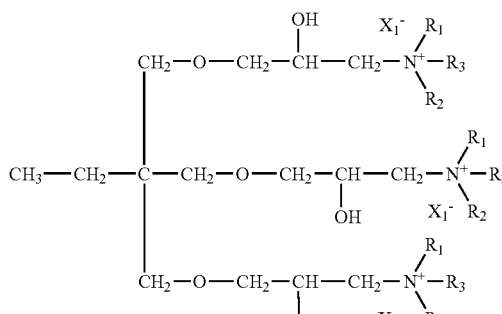

A; 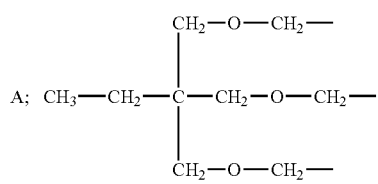

(8)
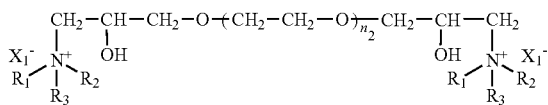

A; 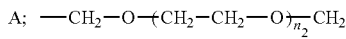

($n_2$: an integer of 1 to 22)

(9)
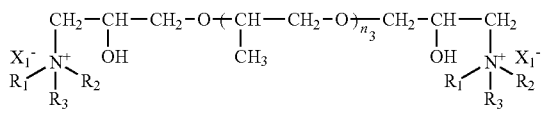

A; 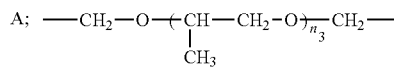

($n_3$: an integer of 1 to 3)

(In general formulae (2) through (9), $R_1$ and $R_2$ each separately is a group selected from the group consisting of a hydroxyalkyl group, an ether group, an aromatic group, an aromatic-substituted alkyl group, an unsaturated hydrocarbon group and an alkyl group, $R_3$ indicates a benzyl group, an allyl group or an alkyl group with 1 to 5 carbon atoms, A is an epoxy compound residue, and $X_1^-$ is $Cl^-$, $Br^-$ or $CH_3SO_4^-$.)

Furthermore, It is desirable that the organo-sulfur compound be a compound which has a structural formula expressed by the above general formula (10) or (11).

The following compounds may be cited, and are desirable for use, as organo-sulfur compounds expressed by the above general formula (10).

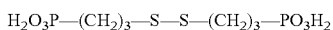

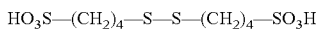

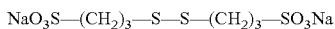

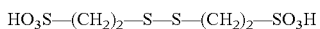

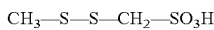

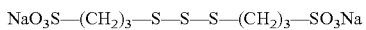

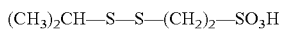

Furthermore, the following compounds may be cited, and are desirable for use, as compounds expressed by the above general formula (11).

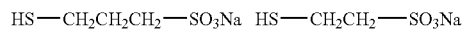

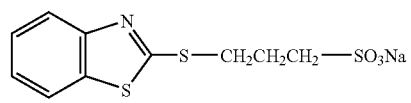

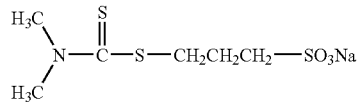

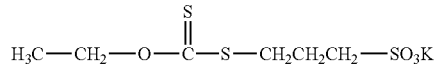

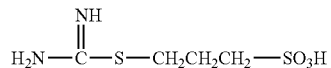

The ratio of the quaternary amine compound and the organo-sulfur compound in the electrolytic solution is in the range of 1:5 to 5:1 in terms of weight ratio, and is preferably in the range of 1:2 to 2:1. It is desirable that the concentration of the quaternary amine compound in the copper electrolytic solution be 1 to 50 ppm.

Besides the above-mentioned organo-sulfur compound and quaternary amine compound with a specific skeleton, universally known additives, e. g., polyether compounds such as polyethylene glycol, polypropylene glycol and the like, and other compounds such as polyethyleneimine, phenazine dyes, glue, cellulose and the like, may be added to the copper electrolytic solution.

Furthermore, the copper-clad laminated board obtained by laminating the electrolytic copper foil of the present invention is a copper-clad laminated board which is superior in terms of elongation and tensile strength at ordinary temperatures and high temperatures.

In the present invention, the electrolytic copper foil is manufactured using the above-mentioned electrolytic copper solution and bonded onto a substrate of a printed wiring board and so on to obtain a copper-clad laminated board. The thus obtained copper-clad laminated board has a high elongation both at ordinary and high temperatures coupled with a high tensile strength both at ordinary and high temperatures.

The above-mentioned electrolytic copper foil of the present invention can be manufactured by forming a copper layer directly onto the cathode drum immersed in the electrolytic solution, as shown in FIG. 4. Alternatively, the electrolytic copper foil may be formed onto one surface or both surfaces of an insulating film brought into contact with the cathode drum to obtain a flexible electrolytic copper foil supported by the film. The thus obtained film-supported electrolytic copper foil can be used as a two-layer flexible substrate constituted of a conductive copper layer formed directly onto an insulating film without using an adhesive. The insulating film has an underlying metallic layer, for example, of Ni, Cr, Co, Ti, Cu, Mo, Si or V, singly or in combination of two or more thereof and the underlying metallic layer has been formed on one surface or both surfaces of the film in advance by vapor deposition, sputtering, plating or other known method. The electrolytic copper foil supported by the insulating film can be manufactured, for example, by wrapping the insulating film around the cathode drum so that the underlying metallic layer faces the electrolytic solution and forming a copper layer on the film insulating film via the metallic layer by electrolytic plating. The formed electrolytic copper foil supported by the insulating film is taken up from the cathode drum. In the case where the insulating film has the underlying metallic layers on both surfaces, the insulating film having the copper layer on one surface thereof is wrapped again around the cathode drum in such a manner that the film surface on which no copper layer is formed faces outward and a copper layer is electrodeposited on this surface of the insulating film. Thus, electrolytic copper layers are formed on both surfaces of the insulating film. Examples of the insulating film include thermosetting resins such as polyimide resin, polyester resin, phenol resin and so forth; thermoplastic resins such as polyethylene resin and so forth; condensation resins such as polyamide resin and so forth; and mixtures of two or more of these resins. Among them, polyimide resin and polyester resin are preferably used and polyimide is most preferably used. The thickness of the insulating film is preferably from 10 to 50 μm and the thickness of the underlying layer is preferably from 10 to 500 nm.

EXPLANATION OF SYMBOLS

1 Cathode drum
2 Anode
3 Gap
4 Raw foil

BEST MODE FOR CARRYING OUT THE INVENTION

The present invention will be described in detail in terms of examples below.

Example of Synthesis of Quaternary Amine Compound with Specific Skeleton 10.0 g of an epoxy compound expressed by the chemical formula shown below (Denacol EX-521 manufactured by Nagase Kasei Kogyo K.K.) (epoxy groups: 0.0544 mol) and 61.2 g of a 40% aqueous solution of dimethylamine (0.544 mol) were placed in a three-necked flask, and a reaction was performed for 3 hours at 60° C. using a condenser tube with dry ice-methanol as a cooling medium. Subsequently, the condenser tube was removed, and nitrogen gas was blown in and the excess dimethylamine was removed. Afterward, 6.88 g (0.0544 mol) of benzyl chloride was added, and quaternization was accomplished by performing a reaction for 3 hours at 100° C.

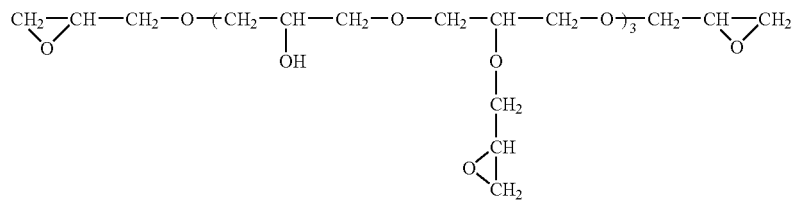

Figure 1:
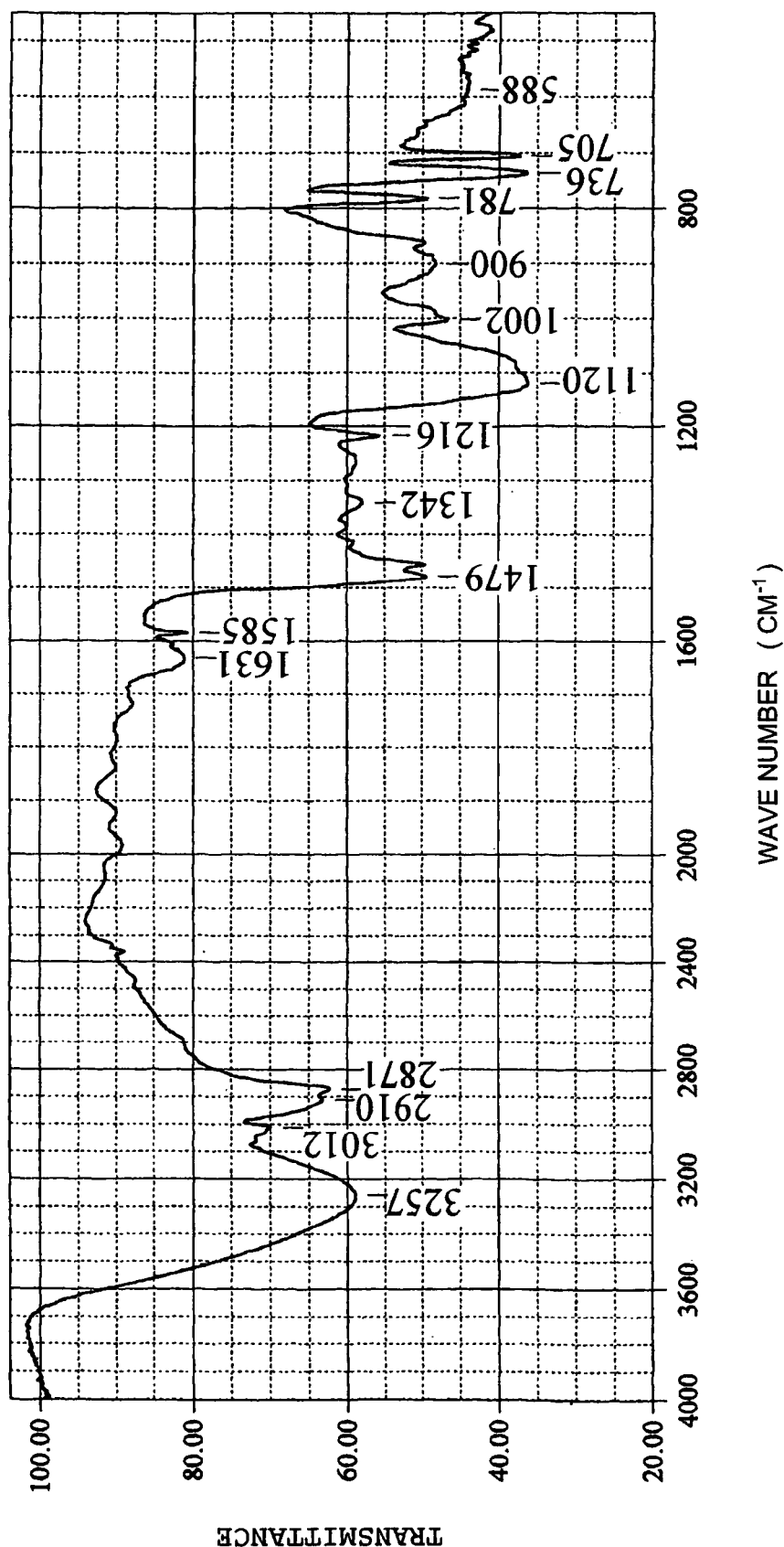
FIG. 1 shows the FT-IR spectrum of a compound obtained as an example of synthesis of a quaternary amine compound which has a specified structure.
Figure 2:
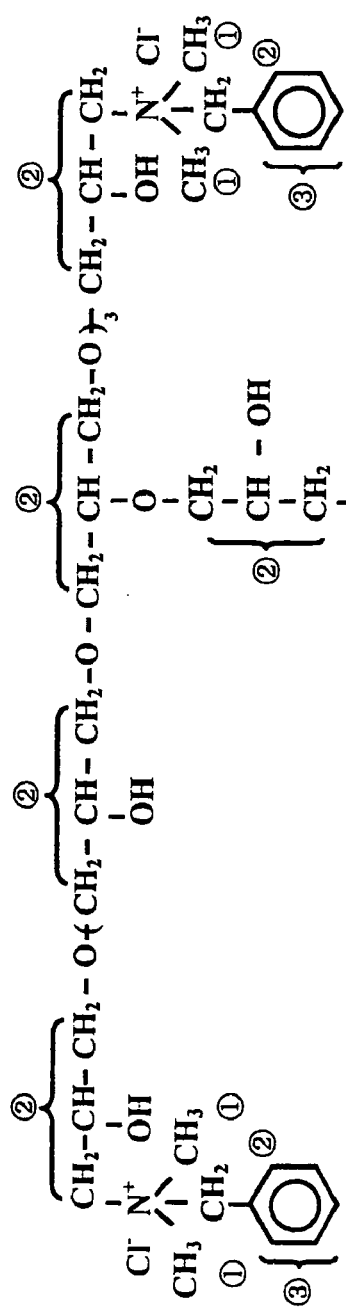
FIG. 2 shows the $^1$H-NMR spectrum of a compound obtained as an example of synthesis of a quaternary amine compound which has a specified structure.
Figure 2:
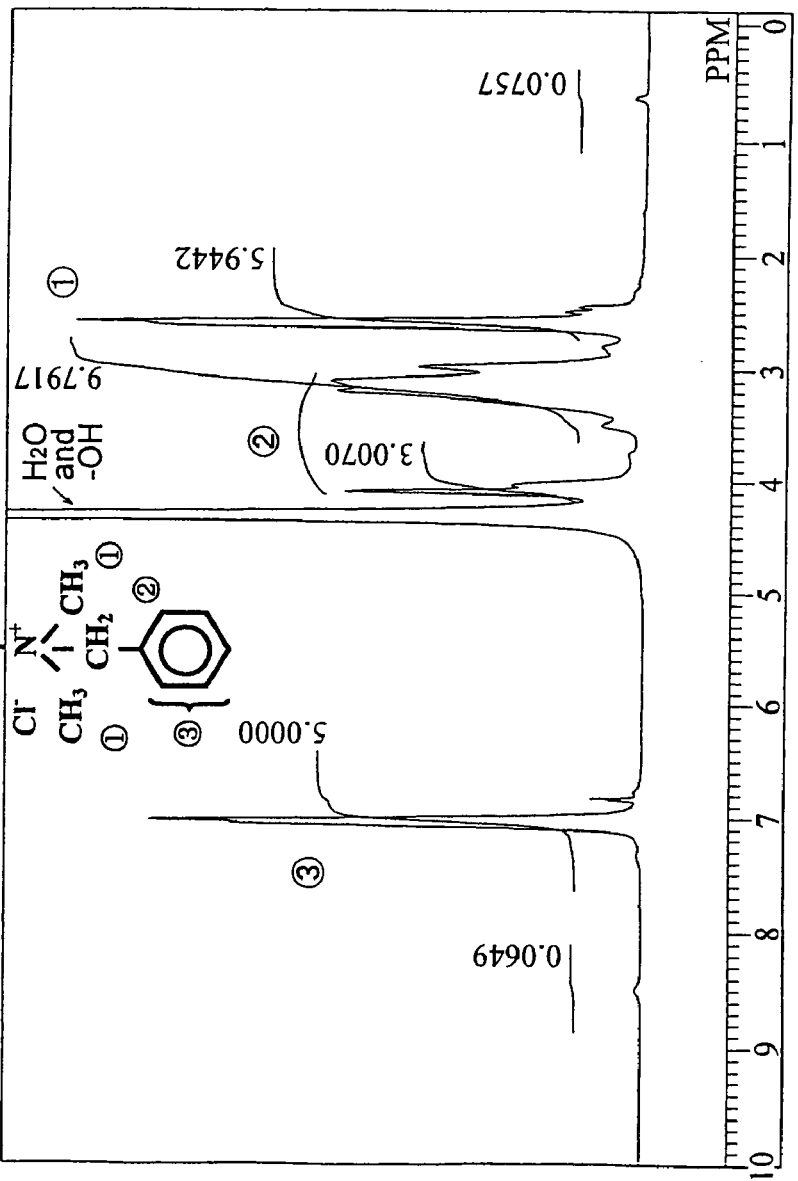
Figure 3:
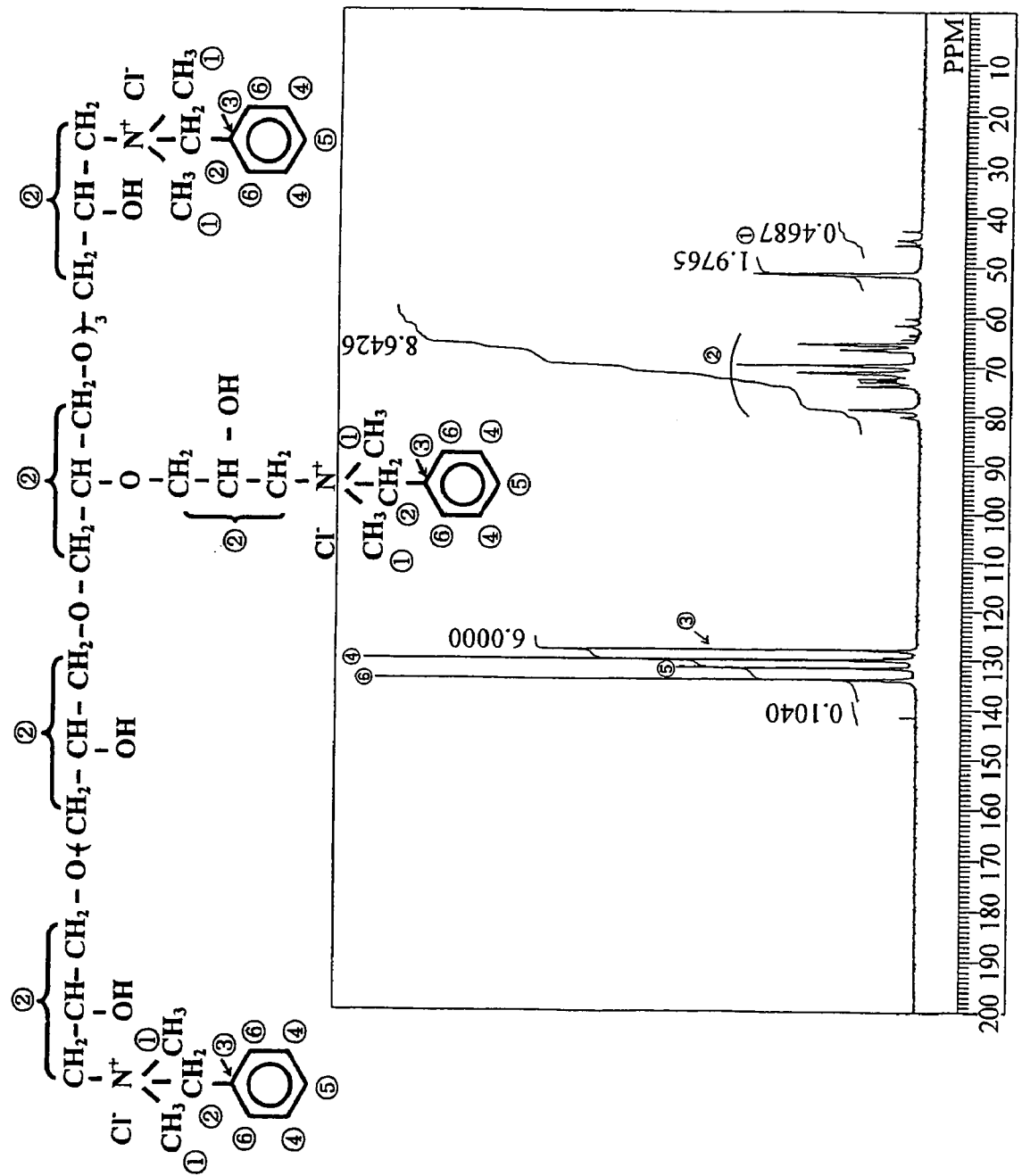
FIG. 3 shows the $^{13}$C-NMR spectrum of a compound obtained as an example of synthesis of a quaternary amine compound which has a specified structure.

The compound that was produced by the reaction was identified by FT-IR, $^1$H-NMR and $^{13}$C-NMR. The FT-IR, $^1$H-NMR and $^{13}$C-NMR spectra of the compound thus obtained are shown in FIGS. 1 through 3. The compound produced was a quaternary amine compound expressed by the following chemical formula.

Temperature: 55 to 57° C.

Additive A: Bis(3-sulfopropyl)disulfide disodium salt (SPS manufactured by Raschig Co.)

Additive B: 3-Mercapto-1-propane sulfonic acid sodium salt (MPS manufactured by Raschig Co.)

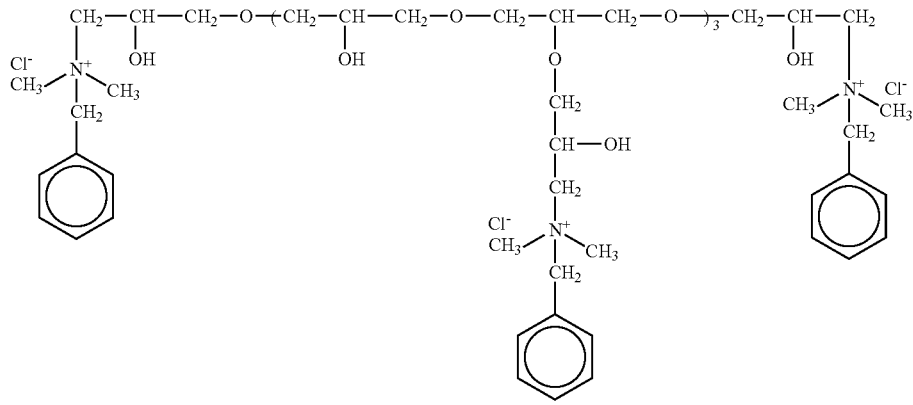

Next, quaternary amine compounds were produced in the same manner as in the manufacture of the above-mentioned quaternary amines, except that the dimethylamine used in the synthesis of the amine compound was changed to dibenzylamine, bis(2-ethoxyethyl)amine, diethanolamine, diphenylamine or diallylamine.

EXAMPLES 1 TO 12 AND COMPARATIVE EXAMPLES 1 TO 9

Figure 4:
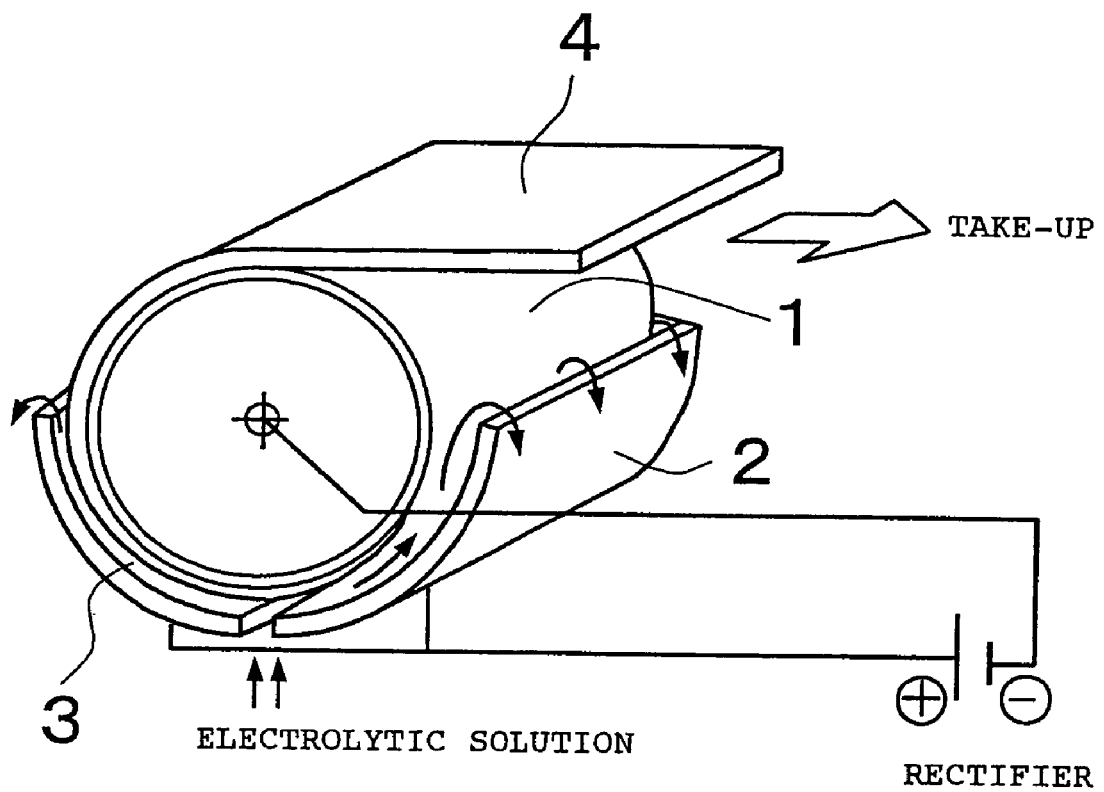
FIG. 4 is a diagram which shows one example of an electrolytic copper foil manufacturing apparatus.

An electrolytic copper foil with a thickness of 35 μm was manufactured using the electrolytic copper foil manufacturing apparatus shown in FIG. 4. The composition of the electrolytic solution was as shown below, and the amounts of additives added were as shown in Table 1.

Cu: 90 g/L $H_2SO_4$: 80 g/L

Cl: 60 ppm

Additive C: Quaternary amine compound with the specified structure obtained in the above-mentioned synthesis example C1: Benzyl chloride modified product of dibenzylamine C2: Benzyl chloride modified product of bis(2-ethoxyethyl)amine C3: Benzyl chloride modified product of diethanolamine C4: Benzyl chloride modified product of diphenylamine C5: Benzyl chloride modified product of diallylamine C6: Benzyl chloride modified product of dimethylamine The surface roughness Rz (μm) of each of the electrolytic copper foils obtained was measured for the side of the rough surface, i.e., the opposite side from the lustrous surface, according to JIS B 0601, and the ordinary-temperature elongation (%), ordinary-temperature tensile strength (kgf/mm$^2$), high-temperature elongation (%) and high-temperature tensile strength (kgf/mm$^2$) were measured according to IPC-TM650. The results are shown in Table 1.

TABLE 1

| | Additive A | Additive B | Additive C (ppm) | | | | | | Rz | Ordinary-temperature elongation | Ordinary-temperature tensile strength | High-temperature elongation | High-temperature tensile strength |
| | (ppm) | (ppm) | C1 | C2 | C3 | C4 | C5 | C6 | (μm) | (%) | (kgf/mm$^2$) | (%) | (kgf/mm$^2$) |
|---|---|---|---|---|---|---|---|---|---|---|---|---|---|
| Example 1 | 50 | 0 | 50 | 0 | 0 | 0 | 0 | 0 | 1.12 | 8.20 | 33.2 | 14.9 | 22.7 |
| Example 2 | 50 | 0 | 0 | 50 | 0 | 0 | 0 | 0 | 1.10 | 6.72 | 31.5 | 17.2 | 22.0 |
| Example 3 | 50 | 0 | 0 | 0 | 50 | 0 | 0 | 0 | 0.95 | 8.80 | 30.5 | 17.9 | 20.0 |
| Example 4 | 50 | 0 | 0 | 0 | 0 | 50 | 0 | 0 | 1.20 | 8.80 | 36.5 | 12.3 | 20.1 |
| Example 5 | 50 | 0 | 0 | 0 | 0 | 0 | 50 | 0 | 1.12 | 7.12 | 33.9 | 11.9 | 21.0 |
| Example 6 | 50 | 0 | 0 | 0 | 0 | 0 | 0 | 50 | 0.99 | 6.82 | 30.5 | 16.5 | 21.5 |
| Example 7 | 0 | 50 | 50 | 0 | 0 | 0 | 0 | 0 | 1.15 | 8.30 | 33.1 | 15.1 | 19.9 |
| Example 8 | 0 | 50 | 0 | 50 | 0 | 0 | 0 | 0 | 1.13 | 6.99 | 30.5 | 16.3 | 23.4 |
| Example 9 | 0 | 50 | 0 | 0 | 50 | 0 | 0 | 0 | 0.98 | 9.20 | 35.0 | 18.2 | 23.1 |
| Example 10 | 0 | 50 | 0 | 0 | 0 | 50 | 0 | 0 | 1.12 | 8.81 | 37.2 | 13.2 | 23.0 |
| Example 11 | 0 | 50 | 0 | 0 | 0 | 0 | 50 | 0 | 1.23 | 7.30 | 36.0 | 12.5 | 21.3 |
| Example 12 | 0 | 50 | 0 | 0 | 0 | 0 | 0 | 50 | 0.94 | 6.90 | 32.1 | 16.9 | 21.0 |
| Comp. Ex. 1 | 0 | 0 | 0 | 0 | 0 | 0 | 0 | 0 | 5.8 | 8.90 | 37.9 | 12.6 | 20.7 |
| Comp. Ex. 2 | 100 | 0 | 0 | 0 | 0 | 0 | 0 | 0 | 5.5 | 0.2 | 10.3 | 1.0 | 15.3 |

TABLE 1-continued

| | Additive A (ppm) | Additive B (ppm) | Additive C (ppm) | | | | | | Rz (μm) | Ordinary-temperature elongation (%) | Ordinary-temperature tensile strength (kgf/mm$^2$) | High-temperature elongation (%) | High-temperature tensile strength (kgf/mm$^2$) |
|---|---|---|---|---|---|---|---|---|---|---|---|---|---|
| | | | C1 | C2 | C3 | C4 | C5 | C6 | | | | | |
| Comp. Ex. 3 | 0 | 100 | 0 | 0 | 0 | 0 | 0 | 0 | 6.1 | 0.2 | 11.2 | 1.2 | 14.9 |
| Comp. Ex. 4 | 0 | 0 | 100 | 0 | 0 | 0 | 0 | 0 | 5.2 | 0.3 | 11.2 | 1.0 | 15.3 |
| Comp. Ex. 5 | 0 | 0 | 0 | 100 | 0 | 0 | 0 | 0 | 5.9 | 0.1 | 11.3 | 1.2 | 16.1 |
| Comp. Ex. 6 | 0 | 0 | 0 | 0 | 100 | 0 | 0 | 0 | 5.2 | 0.2 | 12.4 | 1.5 | 15.1 |
| Comp. Ex. 7 | 0 | 0 | 0 | 0 | 0 | 100 | 0 | 0 | 5.9 | 0.2 | 12.2 | 1.0 | 14.1 |
| Comp. Ex. 8 | 0 | 0 | 0 | 0 | 0 | 0 | 100 | 0 | 5.3 | 0.1 | 12.5 | 1.3 | 16.2 |
| Comp. Ex. 9 | 0 | 0 | 0 | 0 | 0 | 0 | 0 | 100 | 5.7 | 0.1 | 13.2 | 1.0 | 13.3 |

Comp. Ex.: Comparative Example

As is shown in the above Table 1, in Examples 1 through 12, in which the additives of the present invention (organo-sulfur compound and quaternary amine compound with a specified structure) were added, the surface roughness Rz was in the range of 0.94 to 1.23 μm, the ordinary-temperature elongation was 6.72 to 9.20%, the ordinary-temperature tensile strength was 30.5 to 37.2 kgf/mm$^2$, the high-temperature elongation was 11.9 to 18.2%, and the high-temperature tensile strength was 19.9 to 23.4 kgf/mm$^2$. Thus, in spite of the fact that a conspicuously low profile was achieved, the ordinary-temperature elongation, ordinary-temperature tensile strength, high-temperature elongation and high-temperature tensile strength all showed superior characteristics comparable to those of Comparative Example 1, in which no additives were added. On the other hand, in Comparative Example 1 in which no additives were added, and Comparative Examples 2 through 9 in which only one of the additives was added, a low profile could not be achieved. Furthermore, in cases where only one of the additives was added, poor results were also obtained in terms of the ordinary-temperature elongation, ordinary-temperature tensile strength, high-temperature elongation and high-temperature tensile strength.

INDUSTRIAL APPLICABILITY

As was described above, the copper electrolytic solution of the present invention, to which an organo-sulfur compound and a quaternary amine compound which has a specified structure are added, is extremely effective in achieving a low profile in the rough surface of the electrolytic copper foil obtained using this solution. Furthermore, not only the elongation at ordinary temperatures but also the high-temperature elongation characteristics can be effectively maintained, and a high tensile strength can be similarly obtained. The use of the above additives in combination is essential to this invention and the above superior properties cannot be achieved without using them.

What is claimed is:

1. An electrolytic copper foil which is manufactured using a copper electrolytic solution, the copper electrolytic solution containing, as additives, an organo-sulfur compound and at least one quaternary amine compound with a specific skeleton expressed by at least one of the following general formulae (2)-(4), (6), (7) and (9), which is obtained by an addition reaction between a compound which has one or more epoxy groups per molecule and an amine compound, followed by a quaternization of the nitrogen,

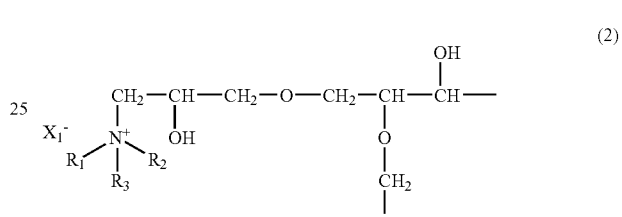

(2)

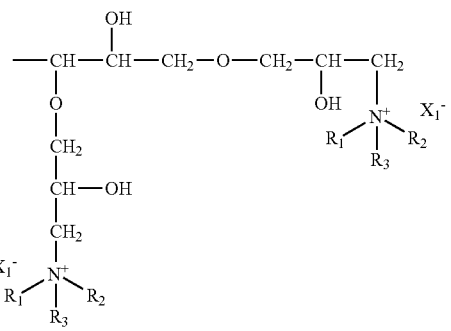

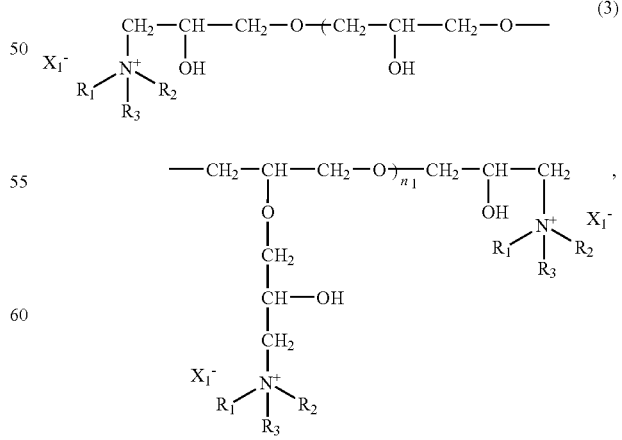

(3)

wherein $n_1$ is an integer of 1 to 5,

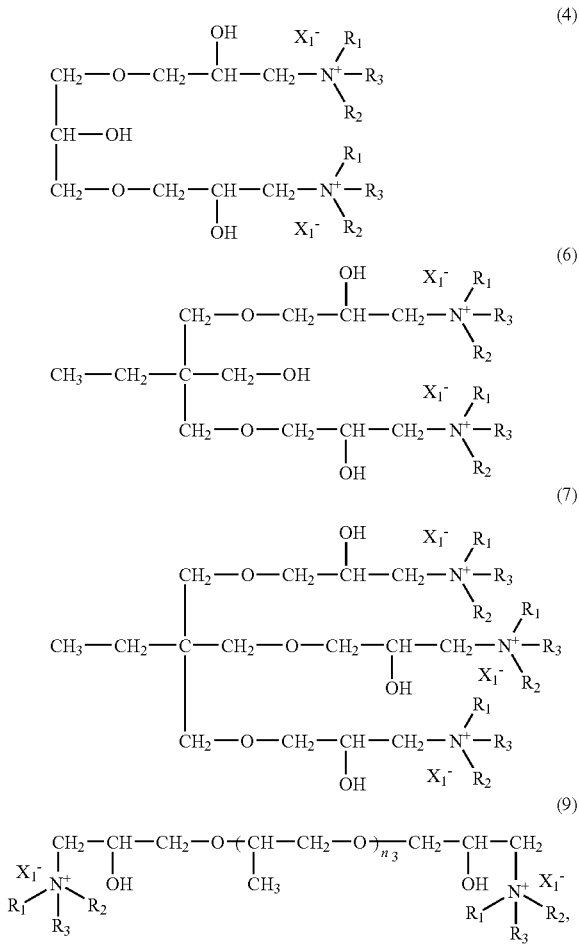

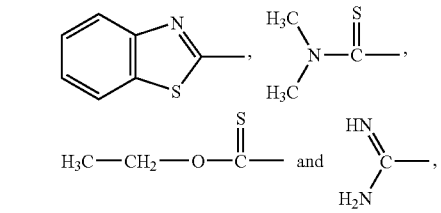

wherein $n_3$ is an integer of 1 to 3 and wherein $R_1$ and $R_2$ in the general formulae (2)-(4), (6), (7) and (9) each separately is a group selected from the group consisting of a hydroxyalkyl group, an ether group, an aromatic group, an aromatic-substituted alkyl group, an unsaturated hydrocarbon group and an alkyl group, $R_3$ is a benzyl group, an allyl group or an alkyl group with 1 to 5 carbon atoms, and $X_1^-$ is $Cl^-$, $Br^-$ or $CH_3SO_4^-$.

2. The electrolytic copper foil according to claim 1, wherein the organo-sulfur compound is a compound expressed by the following general formula (10) or (11)

wherein $R^1$, $R^2$ and $R^3$ each separately is an alkylene group with 1 to 8 carbon atoms, $R^4$ is a group selected from the group consisting of hydrogen, X is a group selected from the group consisting of a sulfonic acid group, a phosphonic acid group, and a sulfonic acid- or phosphonic acid-alkali metal salt group or ammonium salt group, Y is a group selected from the group consisting of a sulfonic acid group, a phosphonic acid group, and a sulfonic acid- or phosphonic acid-sodium or potassium salt group, Z is hydrogen, sodium or potassium, and $n_4$ is 2 or 3.

3. The electrolytic copper foil according to claim 1, wherein the electrolytic copper foil has a surface roughness Rz of 0.94 to 1.23 μm, an ambient temperature elongation of 6.72 to 9.20%, an ambient temperature tensile strength of 30.5 to 37.2 kgf/mm², a 180° C. temperature elongation of 11.9 to 18.2%, and a 180° C. temperature tensile strength of 19.9 to 23.4 kgf/mm² and the ambient temperature elongation and tensile strength and the 180° C. temperature elongation and tensile strength are measured according to IPC-TM 650.

4. A laminate comprising the electrolytic copper foil according to claim 1, formed on an insulating resin film.

5. The laminate according to claim 4, wherein the insulating resin film is a polyimide resin film.

6. The laminate according to claim 4, wherein the electrolytic copper foil has a surface roughness RZ of 0.94 to 1.23 μm, an ambient temperature elongation of 6.72 to 9.20%, an ambient temperature tensile strength of 30.5 to 37.2 kgf/mm², a 180° C. temperature elongation of 11.9 to 18.2%, and a 180° C. temperature tensile strength of 19.9 to 23.4 kgf/mm² and the ambient temperature elongation and tensile strength and the 180° C. temperature elongation and tensile strength are measured according to IPC-TM 650.

7. A copper-clad laminated board which is formed using the electrolytic copper foil according to claim 1.

8. The copper-clad laminated board according to claim 7, wherein the electrolytic copper foil has a surface roughness Rz of 0.94 to 1.23 μm, an ambient temperature elongation of 6.72 to 9.20%, an ambient temperature tensile strength of 30.5 to 37.2 kgf/mm², a 180° C. temperature elongation of 11.9 to 18.2%, and a 180° C. temperature tensile strength of 19.9 to 23.4 kgf/mm² and the ambient temperature elongation and tensile strength and the 180° C. temperature elongation and tensile strength are measured according to IPC-TM 650.

* * * * *